US010734062B2

(12) United States Patent
Koo et al.

(10) Patent No.: US 10,734,062 B2
(45) Date of Patent: Aug. 4, 2020

(54) SEMICONDUCTOR DEVICE WITH ARRAY CONFIGURATION INCLUDING UPPER SEGMENT, LOWER SEGMENT CLASSIFIED ACCORDING TO REFRESH UNITS, REPAIR CONTROLLERS FOR CONTROLLING REPAIR OPERATION OF UPPER SEGMENT AND LOWER SEGMENT

(71) Applicant: SK hynix Inc., Icheon-si, Gyeonggi-do (KR)

(72) Inventors: Ja Beom Koo, Icheon-si (KR); Sung Soo Chi, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/219,663

(22) Filed: Dec. 13, 2018

(65) Prior Publication Data

US 2019/0385661 A1  Dec. 19, 2019

(30) Foreign Application Priority Data

Jun. 19, 2018  (KR) .................... 10-2018-0070045

(51) Int. Cl.
*G11C 11/406* (2006.01)
*G11C 11/408* (2006.01)
*G11C 29/00* (2006.01)

(52) U.S. Cl.
CPC ........ *G11C 11/4087* (2013.01); *G11C 11/406* (2013.01); *G11C 29/785* (2013.01); *G11C 29/802* (2013.01); *G11C 2211/4065* (2013.01)

(58) Field of Classification Search
CPC .............. G11C 11/4087; G11C 11/406; G11C 2211/4065

See application file for complete search history.

(56) References Cited

U.S. PATENT DOCUMENTS

| 9,153,294 | B2 * | 10/2015 | Kang ................ G11C 11/40622 |
| 9,171,604 | B2 * | 10/2015 | Oh ......................... G11C 11/406 |
| 9,761,330 | B1 * | 9/2017 | Kim ....................... G11C 29/76 |
| 10,490,252 | B2 * | 11/2019 | Ito ......................... G11C 11/4087 |
| 2001/0023093 | A1 * | 9/2001 | Do .......................... G11C 29/70 438/200 |
| 2005/0232036 | A1 * | 10/2005 | Choi ........................ G11C 8/12 365/200 |
| 2007/0147154 | A1 * | 6/2007 | Lee ........................ G11C 11/406 365/222 |
| 2017/0133108 | A1 | 5/2017 | Lee et al. |
| 2018/0090227 | A1 * | 3/2018 | Lee .......................... G11C 7/10 |

* cited by examiner

Primary Examiner — Mushfique Siddique
(74) Attorney, Agent, or Firm — William Park & Associates Ltd.

(57) ABSTRACT

A semiconductor device includes a cell array having an upper segment and a lower segment which are classified according to refresh units. The semiconductor device includes a first repair controller configured to output a first repair signal for controlling a repair operation of the upper segment based on a fuse address, a row address, a second control signal, and selection address being at a first level, and generate a first control signal for controlling a repair operation of the lower segment based on the fuse address, the row address, and selection address.

18 Claims, 9 Drawing Sheets

SEMICONDUCTOR DEVICE WITH ARRAY CONFIGURATION INCLUDING UPPER SEGMENT, LOWER SEGMENT CLASSIFIED ACCORDING TO REFRESH UNITS, REPAIR CONTROLLERS FOR CONTROLLING REPAIR OPERATION OF UPPER SEGMENT AND LOWER SEGMENT

CROSS-REFERENCE TO RELATED APPLICATION

This application claims priority based upon Korean patent application No. 10-2018-0070045, filed on Jun. 19, 2018, the disclosure of which is hereby incorporated in its entirety by reference herein.

BACKGROUND

1. Technical Field

Embodiments of the present disclosure generally relate to a semiconductor device, and more particularly, to a technology for a repair circuit configured to replace a defective cell with a redundancy cell and method to replace a defective cell with a redundancy cell.

2. Related Art

A semiconductor memory device is constructed of a plurality of memory cells which are arranged in the form of a matrix. However, if a defective or failed cell occurs in at least one memory cell from among a plurality of memory cells, it is impossible for a semiconductor memory device to normally operate, so that the semiconductor memory device having the defective cell is regarded as a defective product and abandoned.

Moreover, as the semiconductor memory device has been developed to have a higher degree of integration at a higher speed, there is a higher possibility of causing defective cells. Provided that the entirety of the semiconductor memory device is discarded due to a defect generated in only a few memory cells among all memory cells contained in the semiconductor memory device, the discarding of the entirety of the semiconductor memory device is cost ineffective and is far from high product efficiency.

As a result, a production yield denoted by the ratio of a total number of produced chips to the number of normal chips, which is needed for deciding production costs of semiconductor memory devices, is gradually reduced. Therefore, in order to increase a production yield of semiconductor memory devices, many developers and companies are conducting intensive research into a method for constructing highly-integrated semiconductor memory devices configured to operate at a higher speed and a method for efficiently repairing defective cells.

As an example of a method for repairing the defective cell, a technology for embedding a repair circuit configured to replace a defective cell with a redundancy cell, into the semiconductor memory device has been widely used. Generally, the repair circuit includes redundancy columns/rows in which redundancy memory cells are arranged in rows and columns.

The repair circuit selects the redundancy column/row to substitute for the defective column/row. That is, if a row and/or column address signal for designating a defective cell is input to the repair circuit, the repair circuit selects the redundancy column/row instead of the defective column/row of a memory cell bank.

SUMMARY

In accordance with an embodiment of the present disclosure, a semiconductor device may be provided. The semiconductor device may include a cell array configured to include an upper segment and a lower segment which are classified according to refresh units. The semiconductor device may include a first repair controller configured to output a first repair signal for controlling a repair operation of the upper segment based on a fuse address, a row address, a second control signal, and selection address being at a first level, and generate a first control signal for controlling a repair operation of the lower segment based on the fuse address, the row address, and selection address.

DETAILED DESCRIPTION

Reference will now be made to embodiments of the present disclosure, examples of which are illustrated in the accompanying drawings. Wherever possible, the same reference numbers are used throughout the drawings to refer to the same or like portions.

Various embodiments of the present disclosure may be directed to providing a semiconductor device that substantially obviates one or more problems due to limitations and disadvantages of the related art.

The embodiments of the present disclosure may relate to a semiconductor device for extending a row repair region to another segment region.

Figure 1:
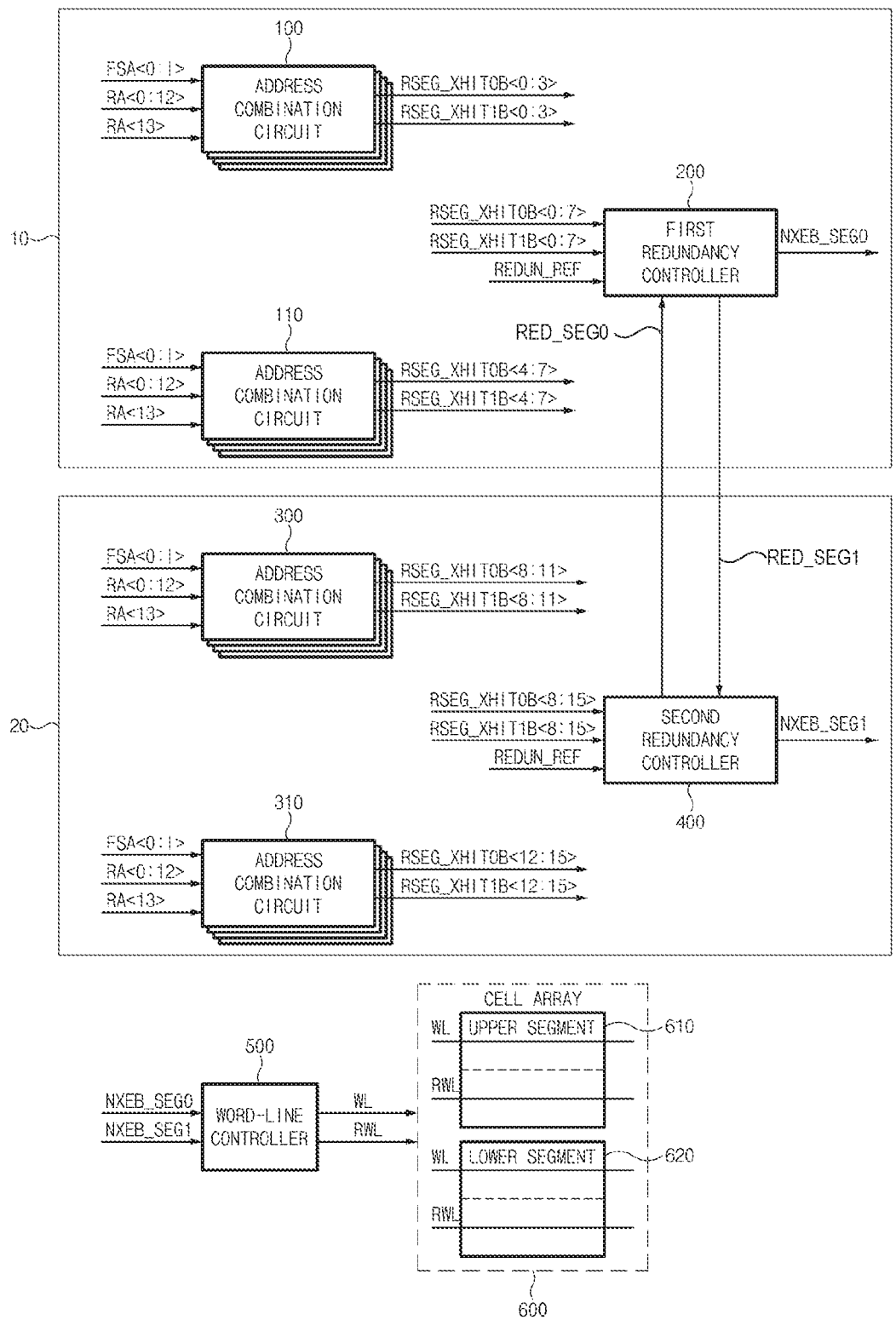
FIG. 1 is a schematic diagram illustrating a representation of an example of a semiconductor device according to an embodiment of the present disclosure.

FIG. 1 is a schematic diagram illustrating a representation of an example of a semiconductor device according to an embodiment of the present disclosure.

Referring to FIG. 1, the semiconductor device according to an embodiment of the present disclosure may include repair controllers 10 and 20, a word-line controller 500, and a cell array 600.

The repair controller 10 may generate a repair signal NXEB_SEG0 for controlling a repair operation of an upper segment 610 (to be described later) by combining various kinds of information stored in the upper segment 610. The repair controller 20 may generate a repair signal NXEB_SEG1 for controlling a repair operation of a lower segment 620 (to be described later) by combining various kinds of information stored in the lower segment 620.

The repair controller 10 may include address combination circuits 100 and 110 and a first redundancy controller 200. The repair controller 20 may include address combination circuits 300 and 310 and a second redundancy controller 400.

The address combination circuit 100 may output repair addresses RSEG_XHIT0B<0:3> and RSEG_XHIT1B<0:3> by combining fuse addresses FSA<0:I>, row addresses RA<0:12>, and a selection address RA<13> with one another. The address combination circuit 110 may output repair addresses RSEG_XHIT0B<4:7> and RSEG_XHIT1B<4:7> by combining fuse addresses FSA<0:I>, row addresses RA<0:12>, and a selection address RA<13> with one another.

Although the number of row addresses according to the embodiment of the present disclosure is set to a specific number for convenience of description, the scope or spirit of the present disclosure is not limited thereto, and the number of addresses may also be changed as necessary.

The redundancy controller 200 may output a control signal RED_SEG1 and a repair signal NXEB_SEG0, upon receiving not only repair addresses RSEG_XHIT0B<0:7> and RSEG_XHIT1B<0:7> output from the address combination circuits 100 and 110, but also a refresh flag signal REDUN_REF and a control signal RED_SEG0. In an embodiment, the repair controller 10 may output the repair signal NXEB_SEG0 for controlling a repair operation of the upper segment 610 based on a fuse address FSA<0:1>, a row address, RA<0:12>, a control signal RED_SEG0, and a selection address RA<13> being at a first level. In an embodiment, the repair controller 10 may generate a control signal RED_SEG1 for controlling a repair operation of the lower segment 620 based on the fuse address FSA<0:1>, the row address, RA<0:12>, and the selection address RA<13>.

The repair addresses RSEG_XHIT0B<0:7> may include row address information, segment selection information, and fuse information about the upper segment 610 of the cell array 600. The control signal RED_SEG1 may be used to transmit repair information from the upper segment 610 to the lower segment 620 so as to extend the row repair region to another segment region.

The repair addresses RSEG_XHIT1B<0:7> may include row address information, segment selection information, and fuse information about the lower segment 620 of the cell array 600. The control signal RED_SEG0 may transmit repair information from the lower segment 620 to the upper segment 610 so as to extend the row repair region to another segment region.

The address combination circuit 300 may output repair addresses RSEG_XHIT0B<8:11> and RSEG_XHIT1B<8:11> by combining fuse addresses FSA<0:I>, row addresses RA<0:12>, and a selection address RA<13> with one another. The address combination circuit 310 may output repair addresses RSEG_XHIT0B<12:15> and RSEG_XHIT1B<12:15> by combining fuse addresses FSA<0:I>, row addresses RA<0:12>, and a selection address RA<13> with one another.

The second redundancy controller 400 may output a control signal RED_SEG0 and a repair signal NXEB_SEG1 upon receiving not only repair addresses RSEG_XHIT0B<8:15> and RSEG_XHIT1B<8:15> output from the address combination circuits 300 and 310, but also a refresh flag signal REDUN_REF and a control signal RED_SEG1. In an embodiment, the repair controller 20 may output the repair signal NXEB_SEG1 for controlling a repair operation of the lower segment 620 based on a fuse address FSA<0:1>, a row address, RA<0:12>, a control signal RED_SEG1, and a selection address RA<13> being at a second level. In an embodiment, the repair controller 20 may generate a control signal RED_SEG0 for controlling a repair operation of the upper segment 610 based on the fuse address FSA<0:1>, the row address, RA<0:12>, and the selection address RA<13>.

During a repair operation, the word-line controller 500 may selectively drive a word line WL and a redundancy word line RWL of the cell array 600 in response to the repair signals NXEB_SEG0 and NXEB_SEG1. For example, when the repair signal NXEB_SEG0 is activated, the word-line controller 500 may control driving of the word line WL and the redundancy word line RWL of the upper segment 610. For example, when the repair signal NXEB_SEG1 is activated, the word-line controller may control driving of the word line WL and the redundancy word line RWL of the lower segment 620.

The cell array 600 may include the upper segment 610 and the lower segment 620 which are classified according to prescribed refresh units. Each of the upper segment 610 and the lower segment 620 may further include a normal memory cell driven by a normal word line WL and a redundancy memory cell driven by a redundancy word line RWL.

If a defect or failure occurs in a cell, the redundancy circuit may pre-recognize the defect or failure of the cell through a test, such that a cell contained in the redundancy circuit instead of the defective cell can be accessed when a request for accessing the corresponding cell occurs. In this case, the redundancy circuit may refer to a set (or aggregate) of redundant memory cells additionally contained in the memory, such that the redundant memory cell(s) may be used as substitute cell(s) of the defective cell(s). The redundancy memory cell is a circuit for repairing a defective memory cell (hereinafter referred to as a repair target memory cell) when a defect or failure occurs in a normal memory cell.

Furthermore, when the repair target memory cell is accessed during a read or write operation, a normal memory cell instead of the repair target memory cell is accessed. In this case, the accessed memory cell is a redundancy memory cell. Therefore, if an address corresponding to the repair target memory cell is input to the semiconductor memory device, the operation (hereinafter referred to as a repair operation) for accessing the redundancy memory cell instead of the repair target memory cell is performed.

Meanwhile, a row repair operation in the semiconductor memory device (for example, DRAM) may be associated with the refresh operation. During a refresh operation time, repaired word lines and non-repaired word lines should normally operate without any problems, such that it is preferable that a predetermined refresh operation unit be identical to a row repair unit in the majority of cases.

A word line having a specific refresh unit may be constructed on a segment basis, and a plurality of segments may be simultaneously refreshed during a prescribed refresh operation time based on specification. However, when the segments simultaneously perform the refresh operation, word lines between the segments may collide with each other by a repaired word line. To prevent such collision between word lines, a method for controlling the repair operation to be performed only within the same segment has been proposed.

However, if the number of redundancy word lines RWL capable of substituting for word lines WL to increase a production yield (productivity) is increased, the number of net dies may be reduced by the increased number of redundancy word lines. In order to address this issue, assuming that the number of redundancy word lines RWL remains unchanged and the row repair region limited in refresh units is extended to other segment regions, it can be expected that the production yield (productivity) will be increased.

Therefore, during the repair operation, the semiconductor device according to an embodiment of the present disclosure may use not only redundancy word lines RWL contained in the same segment, but also repair word lines contained in different segment regions.

In other words, when the repair controller 10 is refreshed in prescribed refresh units based on specification, the repair controller 10 may use redundancy word lines contained in different segment regions (e.g., lower segments) by transmitting a control signal RED_SEG1 to the second redundancy controller 400 of repair controller 20. Likewise, when the repair controller 20 is refreshed in prescribed refresh units based on specification, the repair controller 20 may use redundancy word lines contained in different segment regions (e.g., upper segments) by transmitting a control signal RED_SEG0 to the first redundancy controller 200 of repair controller 10.

Figure 2:
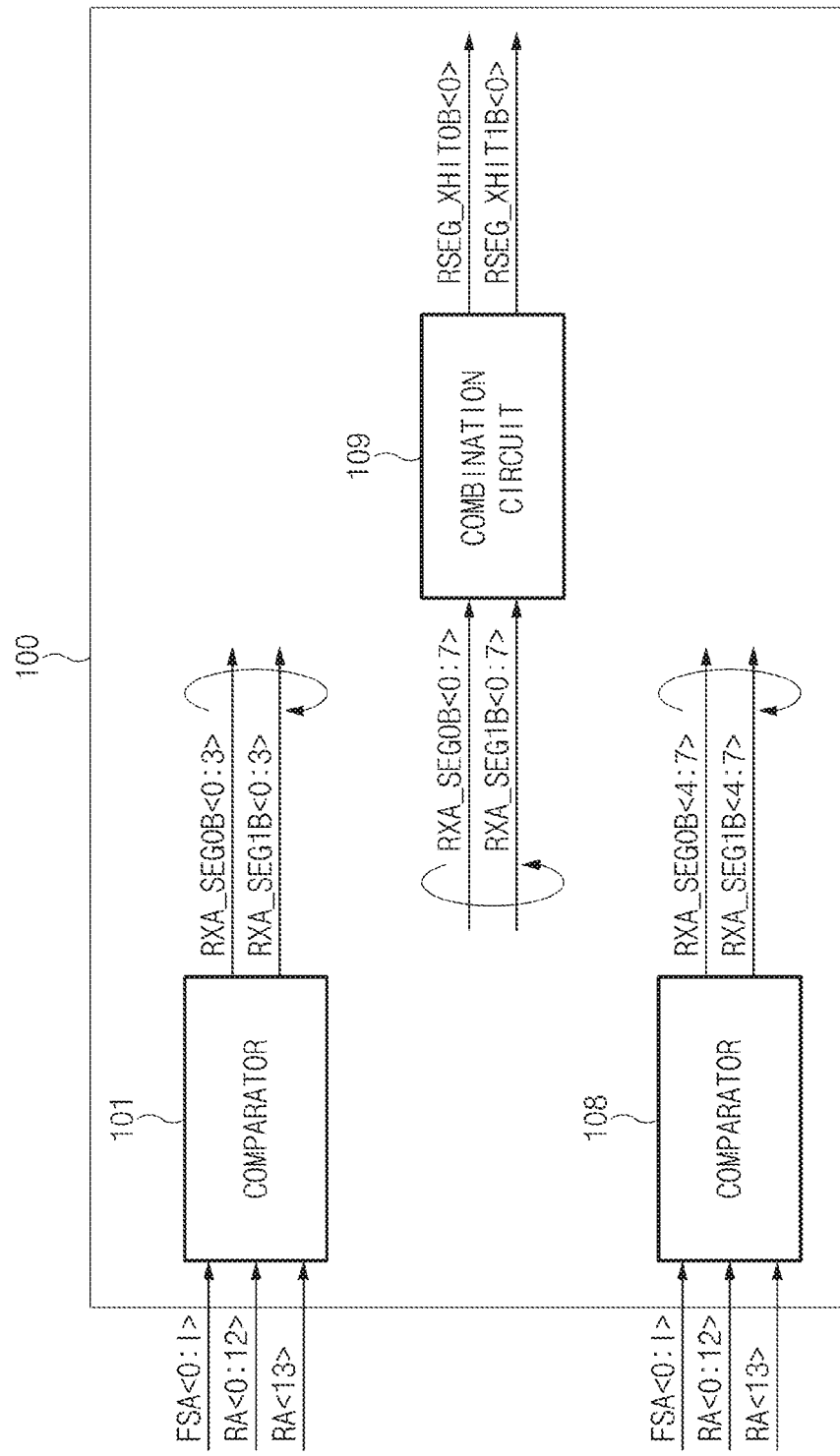
FIG. 2 is a schematic diagram illustrating a representation of an example of each of address combination circuits shown in FIG. 1 according to an embodiment of the present disclosure.

FIG. 2 is a schematic diagram illustrating a representation of an example of each of the address combination circuits 100, 110, 300, and 310 shown in FIG. 1 according to an embodiment of the present disclosure. Structures of the address combination circuits 100, 110, 300, and 310 shown in FIG. 1 are identical to each other, such that only the address combination circuit 100 will hereinafter be described as an example for convenience of description and better understanding of the present disclosure. A plurality of address combination circuits 100 may be shown in FIG. 1, such that the address combination circuits 100 may output a plurality of repair addresses (for example, four repair addresses) RSEG_XHIT0B<0:3> and RSEG_XHIT1B<0:3>. However, detailed structures of the address combination circuits 100 are identical to each other, such that a detailed structure of only one address combination circuit 100 will hereinafter be described with reference to FIG. 2 for convenience of description and better understanding of the present disclosure.

Referring to FIG. 2, the address combination circuit 100 may include comparators 101 and 108, and a combination circuit 109.

In this case, the comparator 101 may output addresses RXA_SEG0B<0:3> and RXA_SEG1B<0:3> by comparing fuse addresses FSA<0:I> with row addresses RA<0:12>. The comparator 101 may activate any one of the addresses RXA_SEG0B<0:3> and RXA_SEG1B<0:3> in response to a selection address RA<13>.

The comparator 108 may output addresses RXA_SEG0B<4:7> and RXA_SEG1B<4:7> by comparing fuse addresses FSA<0:I> with row addresses RA<0:12>. The comparator 108 may activate any one of addresses RXA_SEG0B<4:7> and RXA_SEG1B<4:7> in response to a selection address RA<13>.

The combination circuit 109 may output repair addresses RSEG_XHIT0B<0> and RSEG_XHIT1B<0> by combining addresses RXA_SEG0B<0:7> and RXA_SEG1B<0:7> received from the comparators 101 and 108.

Figure 3:
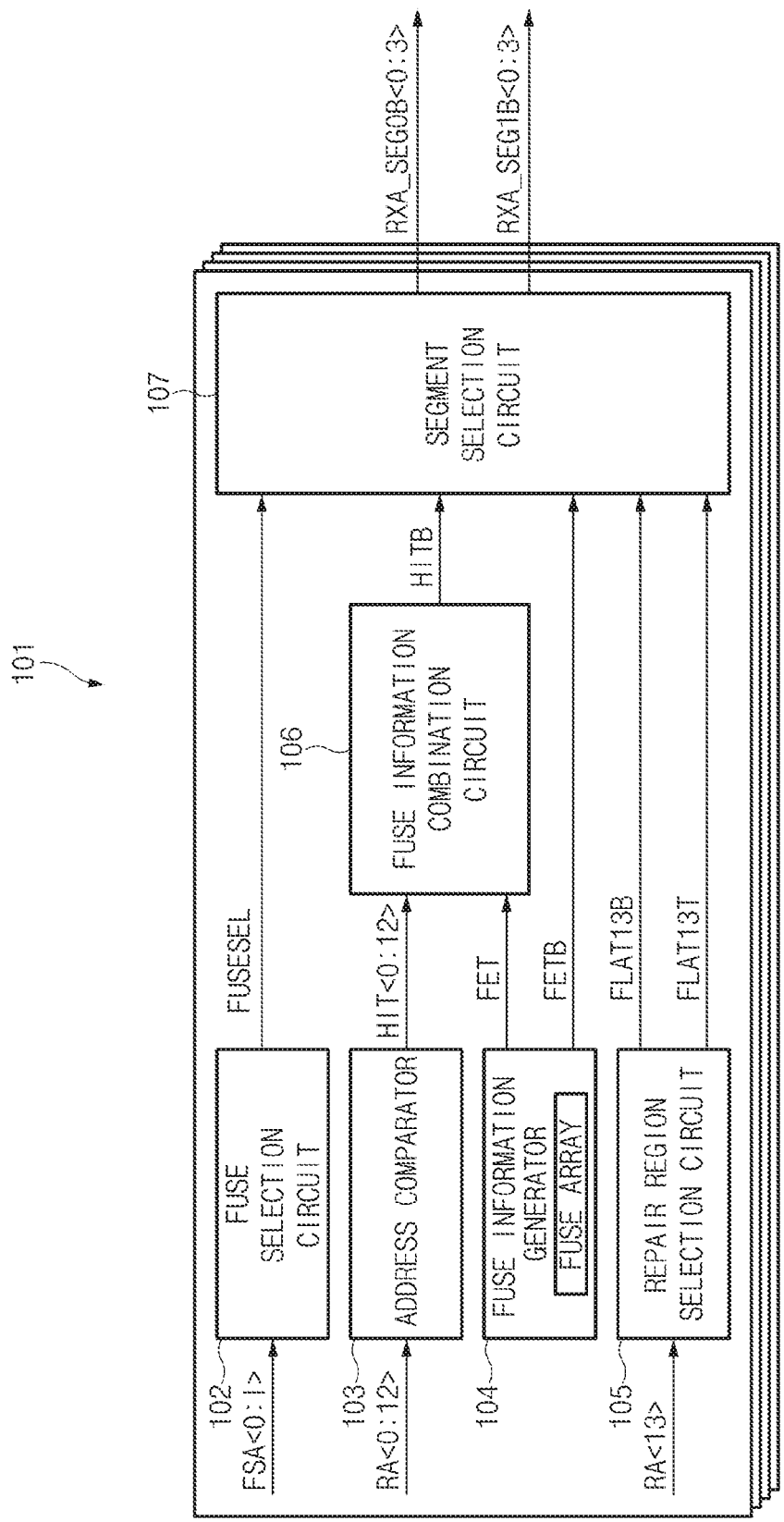
FIG. 3 is a circuit diagram illustrating a representation of an example of each of comparators shown in FIG. 2 according to an embodiment of the present disclosure.

FIG. 3 is a circuit diagram illustrating a representation of each of the comparators 101 and 108 shown in FIG. 2 according to an embodiment of the present disclosure. Structures of the comparators 101 and 108 are identical to each other, such that only the comparator 101 will hereinafter be described as an example for convenience of description and better understanding of the present disclosure.

The comparator 101 may include a fuse selection circuit 102, an address comparator 103, a fuse information generator 104, a repair region selection circuit 105, a fuse information combination circuit 106, and a segment selection circuit 107.

In this case, the fuse selection circuit 102 may output a fuse selection signal FUSESEL indicating selected fuse information in response to the fuse addresses FSA<0:I>. During a redundant refresh operation, redundancy word lines RWL of the upper segment 610 and the lower segment 620 may be sequentially activated by the fuse selection signal FUSESEL, such that a redundant region may be refreshed.

The address comparator 103 may output repair selection signals HIT<0:12> by comparing row addresses RA<0:12> with one or more prestored fail addresses. The repair selection signals HIT<0:12> may include fail address information, and may indicate address information to be repaired.

The fuse information generator 104 may output fuse use signals FET and FETB indicating fuse usage information using fuse cutting information stored in a fuse array. In this case, the fuse use signal FET may be an inversion signal of the other fuse use signal FETB. When the repair operation is performed due to the presence of a defective cell, the fuse use signal FET may include specific information indicating whether the fuse is used, thereby controlling the repair operation.

During the refresh operation, all segments of the cell array 600 may simultaneously operate. However, it is impossible to determine which segment includes a repaired word line using a refresh address only. Therefore, the semiconductor device according to an embodiment of the present disclosure may detect fuse information through the repair selection signals HIT<0:12> and the fuse use signal FET, such that the semiconductor device may transmit repair information to a segment region including the repaired word line.

Whereas the fuse array of the fuse information generator 104 can be implemented in various formats, an E-fuse array implemented by arranging unit fuse cells in the form of an array may also be used without departing from the scope or spirit of the present disclosure. During an initialization (power-up) operation of a semiconductor integrated circuit (IC), data programmed in the E-fuse array is read and is then stored in a register. Thereafter, the semiconductor device may perform the repair operation using data stored in the register.

The E-fuse array may perform programming of a failed address by rupturing a fuse set, such that the E-fuse array may store use information of the fuse therein. It is possible to access a redundancy memory cell contained in a redundant region of the cell array 600 in response to a fuse signal contained in the E-fuse array.

For example, if a row address is not stored in the fuse set of the E-fuse array, this means that a used fuse is not present. In contrast, if a row address is stored in the fuse set of the E-fuse array, this means that a used fuse is present.

The repair region selection circuit 105 may output segment selection signals FLAT13B and FLAT13T in response to a selection address RA<13>. In this case, the segment selection signal FLAT13B may be a signal for selecting the upper segment 610 of the cell array 600, and the segment selection circuit 105 may be a signal for selecting the lower segment 620 of the cell array 600.

For example, upon receiving the selection address RA<13> at a low level, the repair region selection circuit 105 may select the upper segment 610 by activating the selection signal FLAT13B. In contrast, upon receiving the selection address RA<13> at a high level, the repair region selection circuit 105 may select the lower segment 620 by activating the segment selection signal FLAT13T.

The fuse information combination circuit 106 may combine the repair selection signals HIT<0:12> with the fuse use signal FET, and may thus output a redundancy enable signal HITB needed to control activation of the redundancy word line RWL. For example, the fuse information combination circuit 106 may combine the repair selection signals HIT<0:12> with the fuse use signal FET. In this case, when the repair selection signals HIT<0:12> and the fuse use signal FET are activated, the fuse information combination circuit 106 may activate the redundancy enable signal HITB, and may then output the activated redundancy enable signal HITB.

The segment selection circuit 107 may output addresses RXA_SEG0B<0:3> and RXA_SEG1B<0:3>, upon receiving the fuse selection signal FUSESEL, the redundancy enable signal HITB, the fuse use signal FETB, and the segment selection signals FLAT13B and FLAT13T.

For example, when the segment selection signal FLAT13B is activated, the segment selection circuit 107 may select the upper segment 610 of the cell array 600 using the addresses RXA_SEG0B<0:3>. Therefore, the segment selection circuit 107 may transmit repaired word line information to the upper segment 610. When the segment selection signal FLAT13T is activated, the segment selection circuit 107 may select the lower segment 620 of the cell array 600 using the addresses RXA_SEG1B<0:3>. Accordingly, the segment selection circuit 107 may transmit repaired word line information to the lower segment 620.

Figure 4:
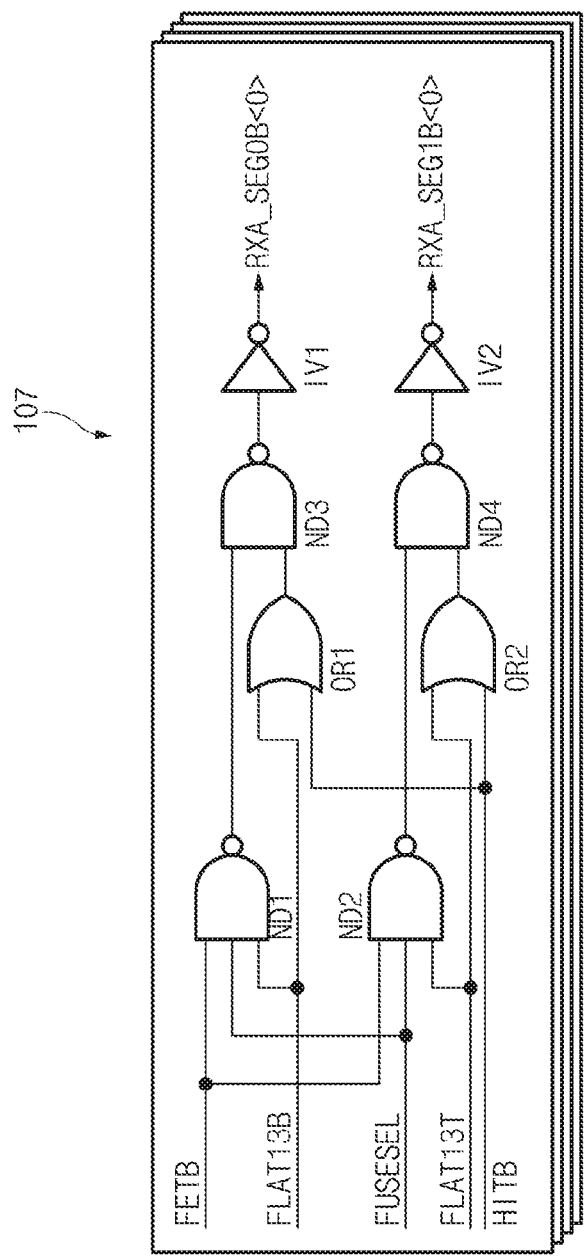
FIG. 4 is a circuit diagram illustrating a representation of an example of a segment selection circuit shown in FIG. 3 according to an embodiment of the present disclosure.

FIG. 4 is a circuit diagram illustrating a representation of an example of the segment selection circuit 107 shown in FIG. 3 according to an embodiment of the present disclosure.

Referring to FIG. 4, although a plurality of segment selection circuits 107 may be used to output a plurality of addresses RXA_SEG0B<0:3> and RXA_SEG1B<0:3>, the embodiment of FIG. 4 will disclose only one address RXA_SEG0B<0> for convenience of description and better understanding of the present disclosure.

The segment selection circuit 107 may selectively activate the upper segment 610 or the lower segment 620 of the cell array during the repair operation, such that the segment selection circuit 107 may output addresses RXA_SEG0B<0> and RXA_SEG1B<0> for transmitting repair information.

The segment selection circuit 107 may be configured to perform NAND, OR, and inversion operations. For example, the segment selection circuit 107 may include a plurality of NAND gates ND1~ND4, OR gates OR1 and OR2, and inverters IV1 and IV2.

For example, the NAND gate ND1 may perform a NAND operation among the fuse use signal FETB, the fuse selection signal FUSESEL, and the segment selection signal FLAT13B. The NAND gate ND2 may perform a NAND operation among the fuse use signal FETB, the fuse selection signal FUSESEL, and the segment selection signal FLAT13T.

An OR gate OR1 may perform an OR operation between the segment selection signal FLAT13B and a redundancy enable signal HITB. The OR gate OR2 may perform an OR operation between the segment selection signal FLAT13T and the redundancy enable signal HITB.

The NAND gate ND3 may perform a NAND operation between an output signal of the NAND gate ND1 and an output signal of the OR gate OR1. The inverter IV1 may output an address RXA_SEG0B<0> by inverting an output signal of the NAND gate ND3.

The NAND gate ND4 may perform a NAND operation between an output signal of the NAND gate ND2 and an output signal of the OR gate OR2. The inverter IV2 may output an address RXA_SEG1B<0> by inverting an output signal of the NAND gate ND4.

The segment selection circuit 107 may combine the fuse use signal FETB, the redundancy enable signal HITB, and the fuse selection signal FUSESEL according to an activation state of the segment selection signals FLAT13B and FLAT13T, and may thus selectively activate the addresses RXA_SEG0B<0> and RXA_SEG1B<0> according to the result of combination.

For example, when the segment selection signal FLAT13B is activated, the segment selection circuit 107 may perform a logical combination among the fuse use signal FETB, the redundancy enable signal HITB, and the fuse selection signal FUSESEL, and may thus control the address RXA_SEG0B<0> according to the result of combination. In contrast, when the segment selection signal FLAT13T is activated, the segment selection circuit 107 may perform a logical combination among the fuse use signal FETB, the redundancy enable signal HITB, and the fuse selection signal FUSESEL, and may thus control the address RXA_SEG1B<0> according to the result of combination.

Figure 5:
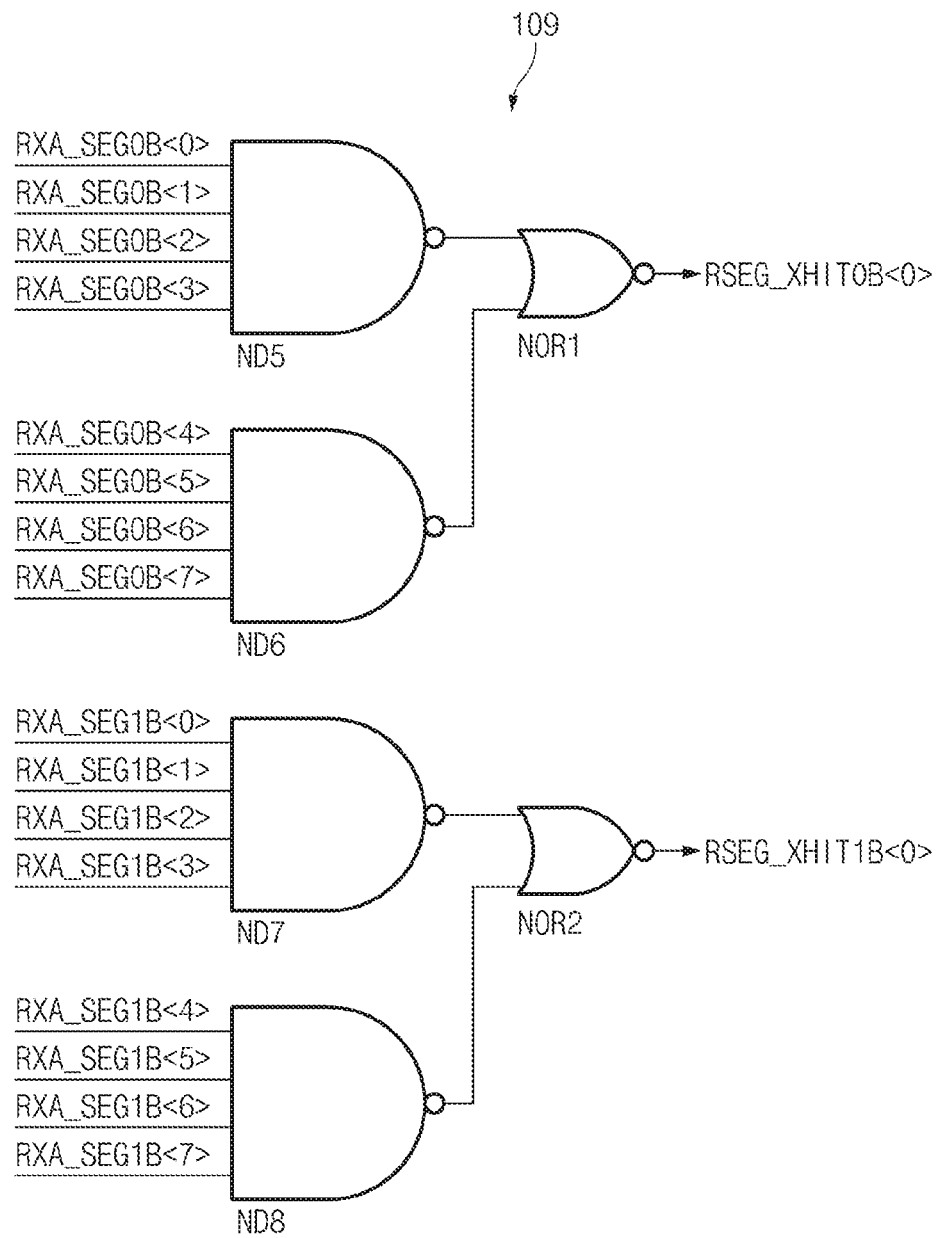
FIG. 5 is a circuit diagram illustrating a representation of an example of a combination circuit shown in FIG. 2 according to an embodiment of the present disclosure.

FIG. 5 is a circuit diagram illustrating a representation of an example of the combination circuit 109 shown in FIG. 2 according to an embodiment of the present disclosure.

Referring to FIG. 5, the combination circuit 109 may combine addresses RXA_SEG0B<0:7> and RXA_SEG1B<0:7>, and may thus output repair addresses RSEG_XHIT0B<0> and RSEG_XHIT1B<0> according to the result of combination.

The combination circuit 109 may include a plurality of NAND gates ND5~ND8 and a plurality of NOR gates NOR1 and NOR2.

The NAND gate ND5 may perform a NAND operation between the addresses RXA_SEG0B<0:3>. The NAND gate ND6 may perform a NAND operation between the addresses RXA_SEG0B<4:7>. The NOR gate NOR1 may output a repair address RSEG_XHIT0B<0> by performing a NOR operation between the NAND gates ND5 and ND6.

The NAND gate ND7 may perform a NAND operation between the addresses RXA_SEG1B<0:3>. The NAND gate ND8 may perform a NAND operation between the addresses RXA_SEG0B<4:7>. The NOR gate NOR2 may output a repair address RSEG_XHIT1B<0> by performing a NOR operation between an output signal of the NAND gate ND7 and an output signal of the NAND gate ND8.

The combination circuit 109 may combining a plurality of addresses RXA_SEG0B<0:7>, and may thus output the repair address RSEG_XHIT0B<0> capable of controlling the upper segment 610 according to the result of combination. The combination circuit 109 may combine a plurality of addresses RXA_SEG1B<0:7>, and may thus output the repair address RSEG_XHIT1B<0> capable of controlling the lower segment 610 according to the result of combination.

Figure 6:
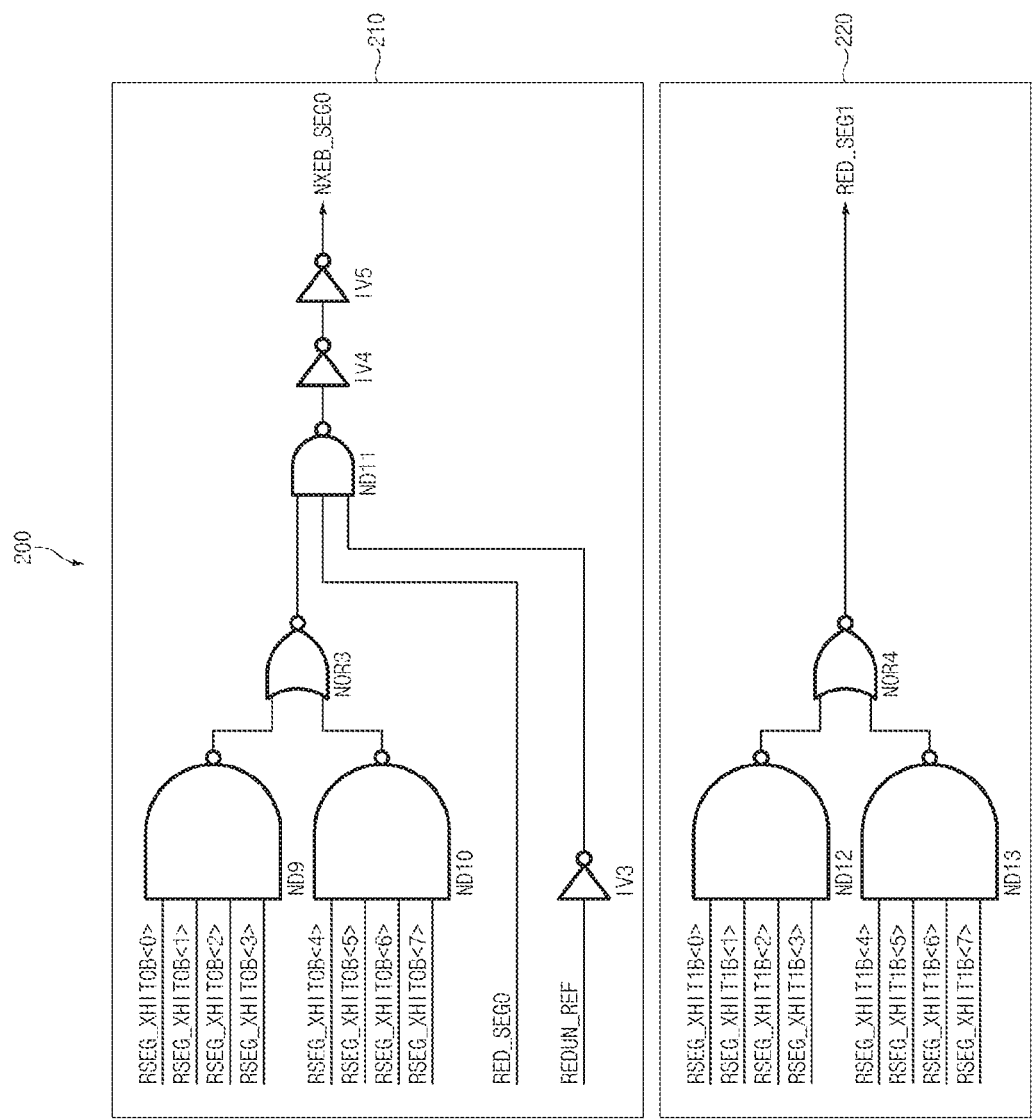
FIG. 6 is a circuit diagram illustrating a representation of an example of a first redundancy controller shown in FIG. 1 according to an embodiment of the present disclosure.

FIG. 6 is a circuit diagram illustrating a representation of an example of the first redundancy controller 200 shown in FIG. 1 according to an embodiment of the present disclosure.

Referring to FIG. 6, the first redundancy controller 200 may include a repair signal controller 210 and a control signal output circuit 220.

The repair signal controller 210 may combine a control signal RED_SEG0 and repair addresses RSEG_XHIT0B<0:7> in response to activation or deactivation of a refresh flag signal REDUN_REF, and may output a repair signal NXEB_SEG0 according to the result of combination.

The repair signal controller 210 may include a plurality of NAND gates ND9~ND11, a NOR gate NOR3, and a plurality of inverters IV3~IV5.

The NAND gate ND9 may perform a NAND operation between the plurality of repair addresses RSEG_XHIT0B<0:3>. The NAND gate ND10 may perform a NAND operation between the plurality of repair addresses RSEG_XHIT0B<4:7>. The NOR gate NOR3 may perform a NOR operation between an output signal of the NAND gate ND9 and an output signal of the NAND gate ND10.

The NAND gate ND11 may perform a NAND operation among an output signal of the NOR gate NOR3, the control signal RED_SEG0, and the refresh flag signal REDUN_REF inverted by the inverter IV3. In this case, the refresh flag signal REDUN_REF may be a flag signal for refreshing a redundant region of the cell array 600. The inverters IV4 and IV5 may output the repair signal NXEB_SEG0 by delaying an output signal of the NAND gate ND11.

The control signal output circuit 220 may output a control signal RED_SEG1 by combining repair addresses RSEG_XHIT1B<0:7>. The control signal output circuit 220 may include a plurality of NAND gates ND12 and ND13 and a NOR gate NOR4.

The NAND gate ND12 may perform a NAND operation between the repair addresses RSEG_XHIT1B<0:3>. The NAND gate ND13 may perform a NAND operation between the repair addresses RSEG_XHIT1B<4:7>. The NOR gate NOR4 may output the control signal RED_SEG1 by performing a NOR operation between an output signal of the NAND gate ND12 and an output signal of the NAND gate ND13.

Upon receiving the control signal RED_SEG0, the repair addresses RSEG_XHIT0B<0:7>, and the refresh flag signal REDUN_REF, the repair signal controller 210 having the above-mentioned constituent elements may selectively activate the repair signal NXEB_SEG0 capable of controlling the repair operation of the upper segment 610. The control signal output circuit 220 may combine the repair addresses RSEG_XHIT1B<0:7>, such that the control signal output circuit 220 may output the control signal RED_SEG1 having repair information of the lower segment 620 to the second redundancy controller 400.

For example, when the refresh flag signal REDUN_REF is deactivated to a low level, a logic level of the repair signal NXEB_SEG0 may be controlled in response to the control signal RED_SEG0 and the repair addresses RSEG_XHIT0B<0:7>. In contrast, when the refresh flag signal REDUN_REF is activated at a high level, the repair signal NXEB_SEG0 may be transitioned to a high level, irrespective of the control signal RED_SEG0 and the repair addresses RSEG_XHIT0B<0:7>. In this case, the redundancy word lines RWL of the upper segment 610 are sequentially activated such that the redundant region is refreshed.

Figure 7:
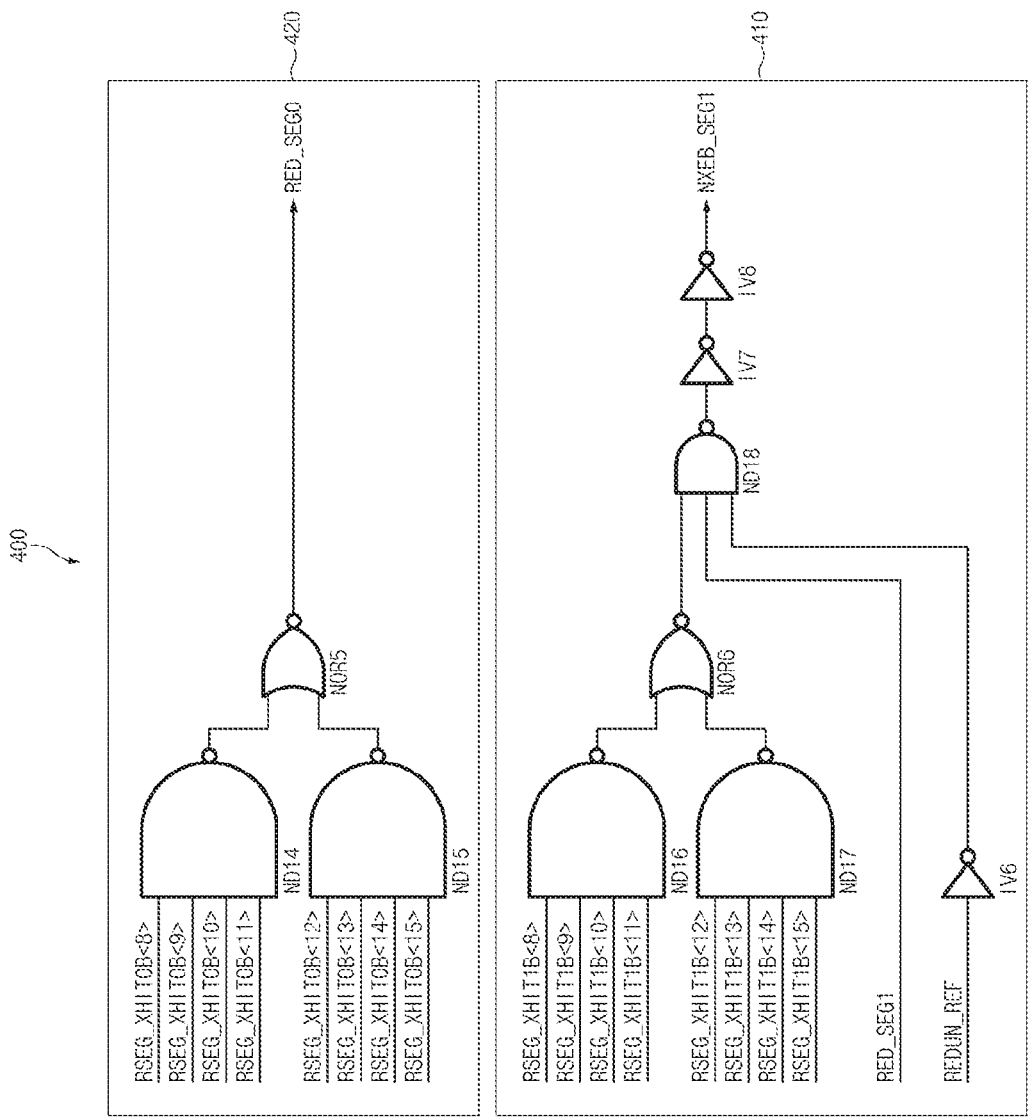
FIG. 7 is a circuit diagram illustrating a representation of an example of a second redundancy controller shown in FIG. 1 according to an embodiment of the present disclosure.

FIG. 7 is a circuit diagram illustrating a representation of an example of the second redundancy controller 400 shown in FIG. 1 according to an embodiment of the present disclosure.

Referring to FIG. 7, the second redundancy controller 400 may include a repair signal controller 410 and a control signal output circuit 420.

In this case, the repair signal controller 410 may combine a control signal RED_SEG1 and repair addresses RSEG_XHIT1B<8:15> in response to activation or deactivation of a refresh flag signal REDUN_REF, and may thus output a repair signal NXEB_SEG1 according to the result of combination.

The repair signal controller 410 may include a plurality of NAND gates ND16~ND18, a NOR gate NOR6, and a plurality of inverters IV6~IV8.

The NAND gate ND16 may perform a NAND operation between the plurality of repair addresses RSEG_XHIT1B<8:11>. The NAND gate ND17 may perform a NAND operation between the plurality of repair addresses RSEG_XHIT1B<12:15>. The NOR gate NOR6 may perform a NOR operation between an output signal of the NAND gate ND16 and an output signal of the NAND gate ND17. The NAND gate ND18 may perform a NAND operation among an output signal of the NOR gate NOR6, the control signal RED_SEG1, and the refresh flag signal REDUN_REF inverted by the inverter IV6. The inverters IV7 and IV8 may output the repair signal NXEB_SEG1 by delaying an output signal of the NAND gate ND18.

The control signal output circuit 420 may output a control signal RED_SEG0 by combining the repair addresses RSEG_XHIT0B<8:15>. The control signal output circuit 420 may include a NOR gate NOR5 and a plurality of NAND gates ND14 and N15.

The NAND gate ND14 may perform a NAND operation between the repair addresses RSEG_XHIT0B<8:11>. The NAND ND15 may perform a NAND operation between the repair addresses RSEG_XHIT0B<12:15>. The NOR gate NOR5 may perform a NOR operation between an output signal of the NAND gate ND14 and an output signal of the NAND gate ND15, and may thus output the control signal RED_SEG0.

Upon receiving the control signal RED_SEG1, the repair addresses RSEG_XHIT1B<8:15>, and the refresh flag signal REDUN_REF, the repair signal controller 410 having the above-mentioned constituent elements may selectively activate the repair signal NXEB_SEG1 capable of controlling the repair operation of the lower segment 620. The control signal output circuit 420 may combine the repair addresses RSEG_XHIT1B<8:15>, such that the control signal output circuit 420 may output the control signal RED_SEG0 having repair information of the upper segment 610 to the first redundancy controller 200.

For example, when the refresh flag signal REDUN_REF is deactivated to a low level, a logic level of the repair signal NXEB_SEG1 may be controlled in response to the control signal RED_SEG1 and the repair addresses RSEG_XHIT1B<8:15>. In contrast, when the refresh flag signal REDUN_REF is activated at a high level, the repair signal NXEB_SEG1 may be transitioned to a high level, irrespective of the control signal RED_SEG1 and the repair addresses RSEG_XHIT1B<8:15>. In this case, the redundancy word lines RWL of the lower segment 620 are sequentially activated such that the redundant region is refreshed.

Figure 8:
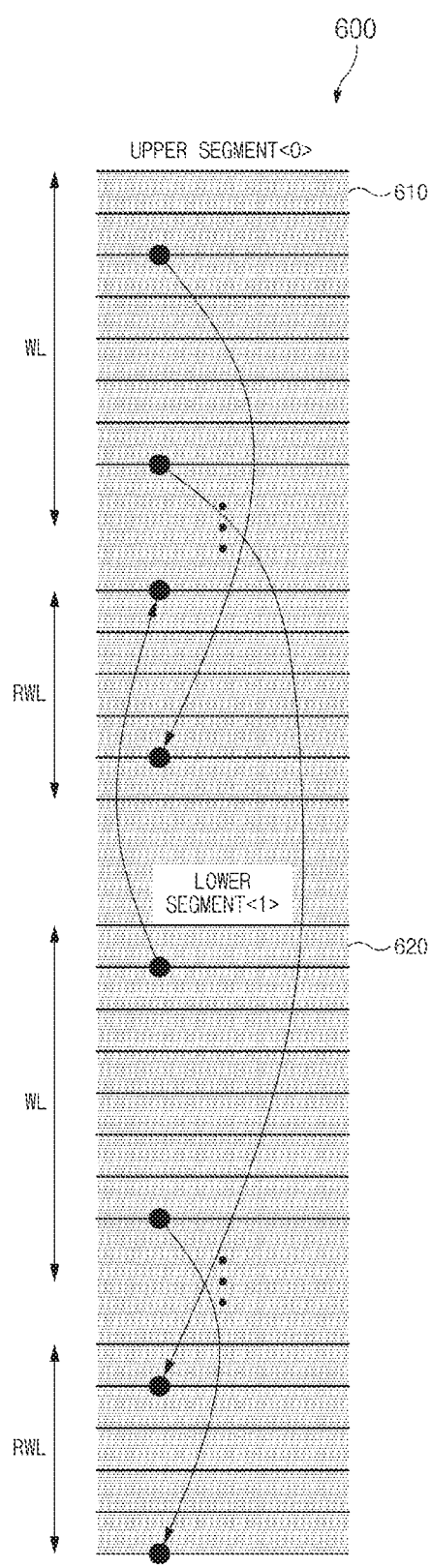
FIG. 8 is a conceptual diagram illustrating a representation of an example of repair operations of a semiconductor device according to an embodiment of the present disclosure.

FIG. 8 is a conceptual diagram illustrating a representation of an example of repair operations of a semiconductor device according to an embodiment of the present disclosure.

Referring to FIG. 8, the cell array 600 may include the upper segment 610 and the lower segment 620 which are classified according to prescribed refresh units. Main cells of the upper segment 610 and the lower segment 620 may be driven by word lines WL. Redundancy cells of the upper segment 610 and the lower segment 620 may be driven by redundancy word lines RWL.

During the repair operation, the semiconductor device according to an embodiment of the present disclosure may use not only redundancy word lines RWL contained in the same segment, but also repair word lines contained in different segment regions. That is, a redundancy cell of the lower segment 620 may be used to substitute for a defective cell of the upper segment 610, such that the defective cell of the upper segment 610 can be replaced with the redundancy cell of the lower segment 620. In addition, a redundancy cell of the upper segment 610 may be used to substitute for a defective cell of the lower segment 620, such that the defective cell of the lower segment 620 can be replaced with the redundancy cell of the upper segment 610.

Figure 9:
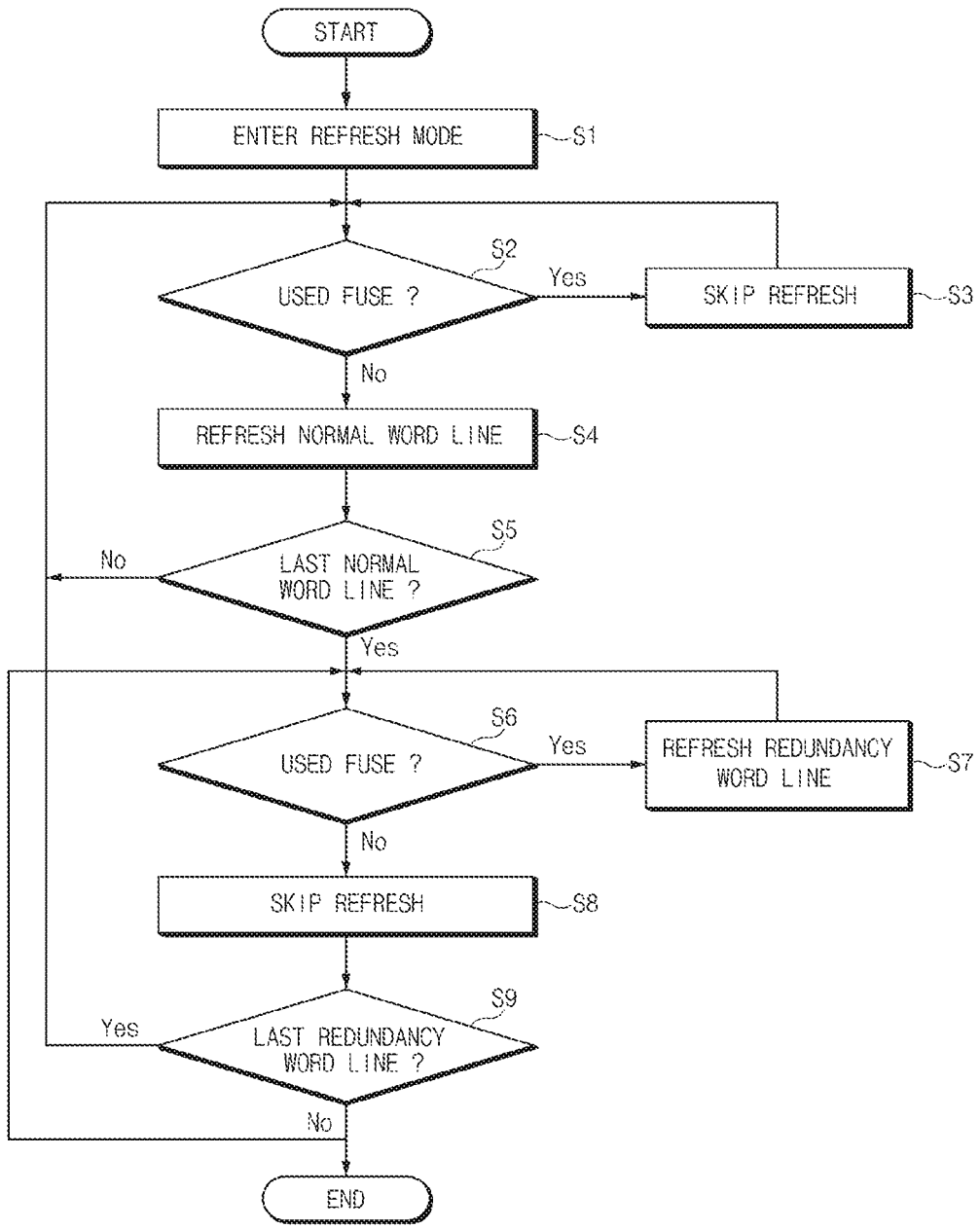
FIG. 9 is a flowchart illustrating a representation of an example of repair operations of a semiconductor device according to an embodiment of the present disclosure.

FIG. 9 is a flowchart illustrating a representation of an example of repair operations of a semiconductor device according to an embodiment of the present disclosure.

First of all, a refresh counter may be initialized during a power-up operation. Therefore, when the semiconductor device enters a refresh mode, the refresh operation may start from a normal word line WL (step S1). Subsequently, the semiconductor device may determine whether a selected fuse is a used fuse (step S2).

If the selected fuse is the used fuse, the semiconductor device may determine a corresponding word line WL to be a repaired word line, and may thus skip over a refresh operation of the corresponding word line WL (step S3). In other words, a row repair unit according to the embodiments of the present disclosure may be extended to at least a predetermined refresh operation unit. Therefore, when the repaired word line is detected during the refresh operation of the normal word line WL, the semiconductor device may skip over the refresh operation of the corresponding word line WL. As a result, collision between word lines of different segments 610 and 620 may be prevented by the repaired word line WL.

In contrast, when the selected fuse is an unused fuse, normal word lines WL of the cell array are driven such that the normal word lines WL can be sequentially refreshed (step S4).

Thereafter, it is determined whether the last normal word line WL of the cell array 600 has been refreshed (step S5). If the last normal word line WL is refreshed, it is determined whether the selected fuse is a used fuse (step S6).

If the selected fuse is the used fuse, the semiconductor device may drive the redundancy word lines RWL of the cell array 600 during a refresh period of an additional redundant region, such that the redundant refresh operations of the redundancy word lines RWL may be sequentially carried out (step S7). If the selected fuse is an unused fuse, the semiconductor device may also skip over the refresh operation of the pre-repaired redundancy word line RWL (step S8)

Subsequently, it is determined whether the last redundancy word line RWL of the cell array 600 has been refreshed (step S9). If the last redundancy word line RWL has been refreshed, the semiconductor device may return to step S2, such that the semiconductor device may re-decide whether the selected fuse is a used fuse. In contrast, if the last redundancy word line RWL has not been refreshed, the semiconductor device may enter the step S6, such that the semiconductor device may re-decide whether the selected fuse is a used fuse.

As is apparent from the above description, the semiconductor device according to the embodiments of the present disclosure may extend a row repair region to another segment region, such that the semiconductor device may increase a production yield without increasing the number of repair word lines and the number of fuses.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
a cell array configured to include an upper segment and a lower segment which are classified according to a predetermined refresh operation units;
a first repair controller configured to output a first repair signal for controlling a repair operation of the upper segment based on a fuse address, a row address, a second control signal, and selection address being at a first level, and generate a first control signal for controlling a repair operation of the lower segment based on the fuse address, the row address, and selection address; and
a second repair controller configured to output a second repair signal for controlling the repair operation of the lower segment based on the fuse address, the row address, the first control signal, and selection address being at a second level, and generate the second control signal for controlling the repair operation of the upper segment based on the fuse address, the row address, and selection address, wherein when the first control signal is activated during the repair operation of the upper segment, a redundancy word line of the lower segment of the cell array is used; and when the second control signal is activated during the repair operation of the lower segment, a redundancy word line of the upper segment of the cell array is used.

2. The semiconductor device according to claim 1, wherein the first repair controller includes:
a first address combination circuit configured to output a first repair address and a second repair address based on the fuse address, the row address, and the selection address;
a second address combination circuit configured to output a third repair address and a fourth repair address based on the fuse address, the row address, and the selection address; and
a first redundancy controller configured to output the first control signal and the first repair signal based on a refresh flag signal, the second control signal, and the first to fourth repair addresses.

3. The semiconductor device according to claim 2, wherein the first address combination circuit includes:
a first comparator configured to output a first address and a second address based on the fuse address and the row address, and activate any one of the first address and the second address based on the selection address;
a second comparator configured to output a third address and a fourth address based on the fuse address and the row address, and activate any one of the third address and the fourth address based on the selection address; and
a combination circuit configured to output the first repair address and the second repair address by performing logic operations on the first to fourth addresses.

4. The semiconductor device according to claim 3, wherein the first comparator includes:
an address comparator configured to output a repair selection signal by comparing the row address with a pre-stored fail address;
a fuse information generator configured to output a fuse use signal indicating fuse usage information;
a repair region selection circuit configured to output a segment selection signal in response to the selection address;
a fuse information combination circuit configured to output a redundancy enable signal by combining the repair selection signal and the fuse use signal; and
a segment selection circuit configured to output the first address and the second address in response to a fuse selection signal, the redundancy enable signal, the fuse use signal, and the segment selection signal.

5. The semiconductor device according to claim 4, wherein the first comparator further includes:
a fuse selection circuit configured to output the fuse selection signal indicating selected fuse information in response to the fuse address.

6. The semiconductor device according to claim 4, wherein the first comparator is configured to selectively activate the first address and the second address by performing a logical combination among the fuse use signal, the redundancy enable signal, and the fuse selection signal according to an activation state of the segment selection signal.

7. The semiconductor device according to claim 4, wherein:
when the segment selection signal is at a first level, the segment selection circuit is configured to control the first address by performing a logical combination among the fuse use signal, the redundancy enable signal, and the fuse selection signal; and
when the segment selection signal is at a second level, the segment selection circuit is configured to control the second address by performing a logical combination among the fuse use signal, the redundancy enable signal, and the fuse selection signal.

8. The semiconductor device according to claim 3, wherein the combination circuit outputs the first repair address by performing a logical combination between the first address and the third address, and outputs the second repair address by performing a logical combination between the second address and the fourth address.

9. The semiconductor device according to claim 2, wherein the refresh flag signal is a flag signal for sequentially performing a refresh operation of at least one redundant region of the cell array.

10. The semiconductor device according to claim 9, wherein the refresh operation of the redundant region is performed in a separate redundant refresh period independent of a normal cell region.

11. The semiconductor device according to claim 2, wherein:
when the refresh flag signal is deactivated, the first redundancy controller is configured to control a logic level of the first repair signal in response to the second control signal, the first repair address, and the third repair address; and
when the refresh flag signal is activated, the first redundancy controller is configured to fix the first repair signal to a first logic level, irrespective of the second control signal, the first repair address, and the third repair address.

12. The semiconductor device according to claim 2, wherein the first redundancy controller includes:
a first repair signal controller configured to combine the second control signal, the first repair address, and the third repair address in response to activation or deactivation of the refresh flag signal, and output the first repair signal according to the result of combination; and
a first control signal output circuit configured to perform a logical combination between the second repair address and the fourth repair address, and output the first control signal to the second redundancy controller according to the result of combination.

13. The semiconductor device according to claim 1, wherein:
when a fuse is used in response to a fuse use signal include specific information indicating whether the fuse is used during a refresh operation, the cell array is configured to skip over a refresh operation of a normal word line.

14. The semiconductor device according to claim 1, wherein:
when a fuse is not used in response to a fuse use signal during a refresh operation, the cell array is configured to skip over a refresh operation of a redundancy word line.

15. The semiconductor device according to claim 1, wherein the second repair controller includes:
a third address combination circuit configured to output a fifth repair address and a sixth repair address based on the fuse address, the row address, and the selection address;

a fourth address combination circuit configured to output a seventh repair address and an eighth repair address based on the fuse address, the row address, and the selection address; and a second redundancy controller configured to output the second control signal and the second repair signal based on a refresh flag signal, the first control signal, and the fifth to eighth repair addresses.

16. The semiconductor device according to claim 15, wherein:

when the refresh flag signal is deactivated, the second redundancy controller is configured to control a logic level of the second repair signal in response to the first control signal, the sixth repair address, and the eighth repair address.

17. The semiconductor device according to claim 15, wherein:

when the refresh flag signal is activated, the second redundancy controller is configured to fix the second repair signal to a first logic level, irrespective of the first control signal, the sixth repair address, and the eighth repair address.

18. The semiconductor device according to claim 15, wherein the second redundancy controller includes:

a second repair signal controller configured to combine the first control signal, the sixth repair address, and the eighth address in response to activation or deactivation of the refresh flag signal, and output the second repair signal according to the result of combination; and a second control signal output circuit configured to perform a logical combination between the fifth repair address and the seventh repair address, and output the second control signal to the first redundancy controller according to the result of combination.

* * * * *